RADIO FREQUENCY POWER AMPLIFIER

Feb. 20, 1973 H. J. GARCIA ET AL 3,717,820

RADIO FREQUENCY POWER AMPLIFIER

Filed Nov. 10, 1971 3 Sheets-Sheet 2

Feb. 20, 1973 H. J. GARCIA ET AL 3,717,820

RADIO FREQUENCY POWER AMPLIFIER

Filed Nov. 10, 1971 3 Sheets-Sheet 3

United States Patent Office 3,717,820
Patented Feb. 20, 1973

3,717,820
RADIO FREQUENCY POWER AMPLIFIER
Hernando Javier Garcia, San Francisco, Calif., and Benjamin Roger Peek, Garland, and Jose Meza, Dallas, Tex., assignors to Integrated Systems Technology, Inc., Garland, Tex.
Filed Nov. 10, 1971, Ser. No. 197,386
Int. Cl. H03f 3/04
U.S. Cl. 330—21 19 Claims

ABSTRACT OF THE DISCLOSURE

An efficient and compact solid state radio frequency power amplifier is disclosed. The amplifier includes a plurality of transistors, capacitors and inductance coils interconnected and grouped in a particular spatial relationship to minimize intercomponent interference. Various groups of components are segregated from the other components of the amplifier by conductive shields and are positioned and oriented in a particular manner with respect to the shields and to each other.

BACKGROUND OF THE INVENTION

This invention relates to radio frequency power amplifiers and more particularly to a solid state radio frequency final power amplifier whose components are spatially oriented in certain relative positions.

Radio frequency power amplifiers have, in the past, generally utilized electron tubes as their active elements. Although such tube-type amplifiers are relatively easy to design and construct and can operate at high frequencies and provide high power output signals, they are generally bulky, heavy and inefficient. For applications where weight and size are an important factor, such as portable radio transmitters, it is oftentimes necessary to utilize solid state radio frequency power amplifiers. Yet, the very purpose of utilizing such amplifiers, to reduce the size and increase the compactness of the circuitry, also gives rise to the problem of intercomponent interference caused by the close physical proximity of the components to each other. The efficiency of a solid state radio frequency power amplifier can be greatly increased simply by the judicious placement and orientation of the components.

SUMMARY OF THE INVENTION

It is an object of the present invention to provide an efficient solid state radio frequency power amplifier.

It is another object of the present invention to provide a radio frequency power amplifier whose components are physically positioned to provide minimal electrical interference among components.

These and other objects of the present invention are realized in a specific illustrative embodiment which includes tuning and impedance-matching input circuitry connected to a first transistor, a second transistor connected to the first transistor via a series-connected capacitor and inductance coil, a third transistor connected to the second transistor via a second series-connected capacitor and inductance coil, and tuning and impedance-matching output circuitry connected to the third transistor. Each of the three collectors of the transistors are connected via a corresponding inductance coil to a power supply. Although the circuitry of the amplifier is known in the art, it has been found that by appropriately positioning and orienting the components of the circuit relative to the other components of the circuit, a significant increase in power output and efficiency can be obtained over that obtained in prior art configurations. The specific positioning and orientation of the components, disclosed hereafter, further provides a highly compact radio frequency power amplifier especially suitable, for example, for portable radio or telephone transmitters.

BRIEF DESCRIPTION OF THE DRAWINGS

A complete understanding of the present invention and of the above and other objects and advantages thereof may be gained from a consideration of the following detailed description presented hereinbelow in connection with the accompanying drawing described as follows.

DETAILED DESCRIPTION

Figure 1:
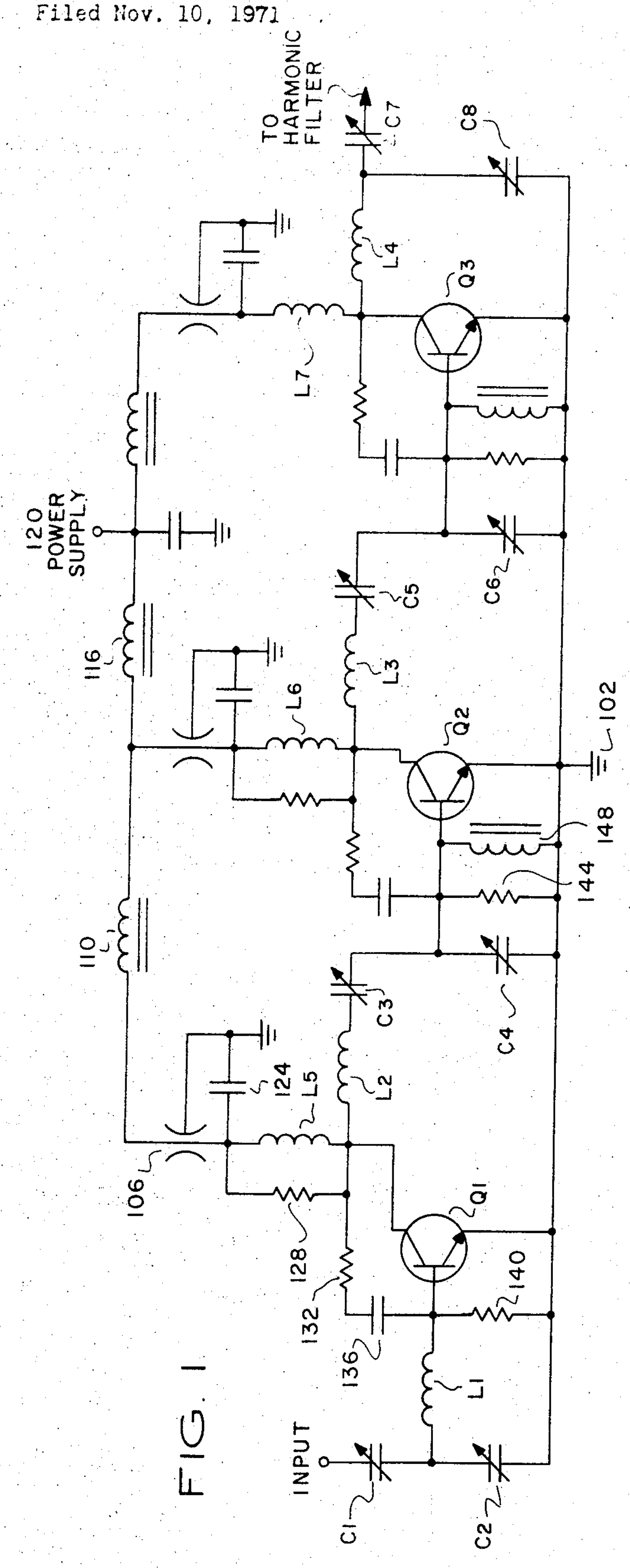
FIG. 1 shows the radio frequency power amplifier circuitry of the present invention.

FIG. 1 shows the circuitry of a radio frequency final power amplifier utilized in the present invention. The circuitry is substantially disclosed in Fairchild Semiconductor's Transistor and Diode Data Catalogue, 1970, pp. 11–9 to 11–14. The FIG. 1 circuit includes input tuning and impedance-matching circuitry, composed of variable capacitors C1 and C2 and an inductance coil L1 connected to a transistor Q1. The function of the input circuitry is to raise the input impedance of the FIG. 1 circuit to match the output impedance of the circuit from which the input signal is obtained. A typical circuit from which such input signal might be obtained is a multiplier of a radio frequency transmitter. The input circuitry connected to the transistor Q1 also provides frequency discrimination or selectivity, the particular frequency for which the circuitry is tuned being determined by the settings of capacitors C1 and C2.

The emitter of the transistor Q1 is connected to a ground potential source 102 and the collector of the transistor is connected via an inductance coil L5, a feedthrough capacitor 106, and two core-wound inductance coils 110 and 116 to a power supply 120. A capacitor 124 connects the power line to ground potential. The capacitors 106 and 124 are for power line decoupling and the coils L5, 110 and 116 operate as chokes. The resistor 128 connected in parallel with the inductor L5 provides for lowering the Q of the inductor L5 and thereby increase the ability of the inductor to filter spurious line fluctuations. A feed-back path from the collector of the transistor Q1 to the base thereof is provided via a resistor 132 and a capacitor 136 to suppress parasitic oscillations. The resistor 140 interconnecting the base of the transistor Q1 to the ground potential source 102 is provided to complete the D.C. path from the power supply 120 to ground.

The collector of the transistor Q1 is interconnected to the base of a second transistor Q2 via an inductance coil L2 and a variable capacitor C3. The base of the transistor Q2 is also connected to ground via a variable capacitor C4 which is connected in parallel with a resistor 144 and an inductance coil 148. The circuitry composed of the inductor L2 and the capacitors C3 and C4 is provided for matching the output impedance of the first transistor stage of the circuit of FIG. 1 with the input impedance of the second transistor stage. The inductor 148 provides a low impedance D.C. path to ground to prevent a voltage buildup at the base of the transistor Q2 and to suppress lower frequency oscillations. The rest of the circuitry associated with the second transistor stage of the FIG. 1 amplifier is similar to that associated with the first transistor stage already discussed.

The FIG. 1 amplifier includes a third transistor stage comprising a transistor Q3 and associated circuitry similar to that in the first and second transistor stages.

Figure 2:
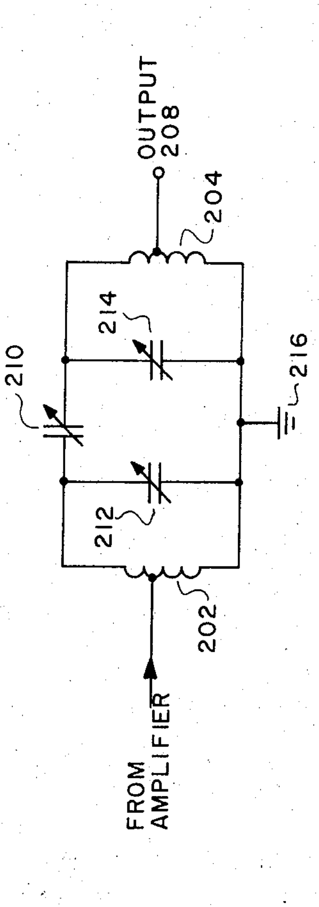
FIG. 2 shows a harmonic filter for use in conjunction with the amplifier of FIG. 1.

An amplified radio frequency signal is produced on the collector of the transistor Q3 and is applied via an inductance coil L4 and a variable capacitor C7 to a harmonic filter shown in FIG. 2. The components L4 and C7 together with a variable capacitor C8 provides for matching the output impedance of the third transistor stage with the input impedance of the circuitry to which the amplified signal is to be applied, e.g. a duplexer and antenna.

The harmonic filter shown in FIG. 2 includes two tapped coils 202 and 204 connected to a ground potential source 216. The tap of coil 202 is connected to capacitor C7 of the FIG. 1 circuit and the tap of coil 204 is connected to an output terminal 208. The top ends of the coils 202 and 204 are connected to different sides of a variable capacitor 210. The filter further includes a variable capacitor 212 connected in parallel with the coil 202 and a variable capacitor 214 connected in parallel with the coil 204. The filter of FIG. 2 serves to attenuate and filter harmonics of the amplified radio frequency signal and other spurious responses.

As indicated earlier, the circuit of FIG. 1 has been previously substantially disclosed in a Fairchild Semiconductor publication and a spatial orientation of the components has been given in Fairchild Semiconductor Data Sheet, issued August 1969 on MSA 8506, MSA 8507 and MSA 8508 power amplifier transistors. It has been found that with the configuration shown in the last noted reference, for an input power supply of 4.6 amps at 12 volts, an output of 25 watts is obtainable from an input of about 100 milliwatts at 158 megahertz. The efficiency of the circuit in the prior art configuration is thus approximately 45 percent.

Figure 3:
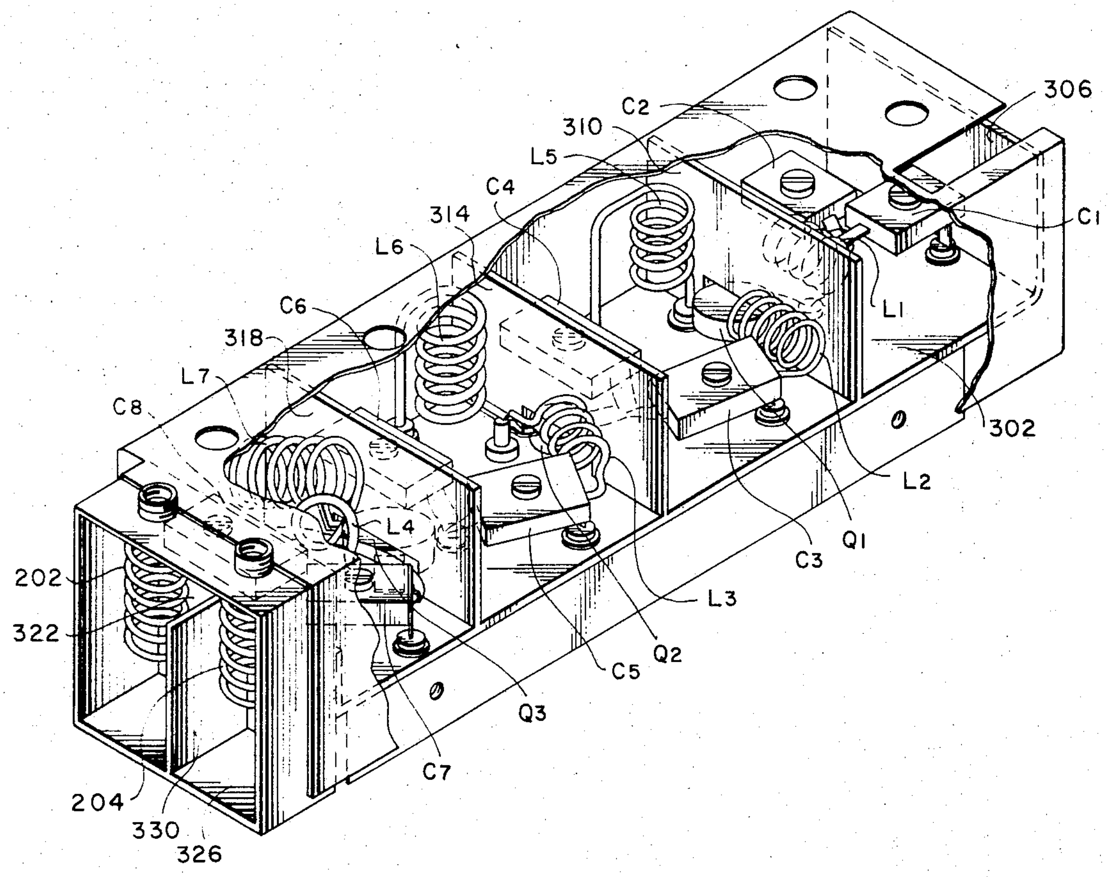
FIG. 3 shows a perspective view of the physical positioning and orientation of the principal components of the FIG. 1 circuit in accordance with the present invention.
Figure 4:
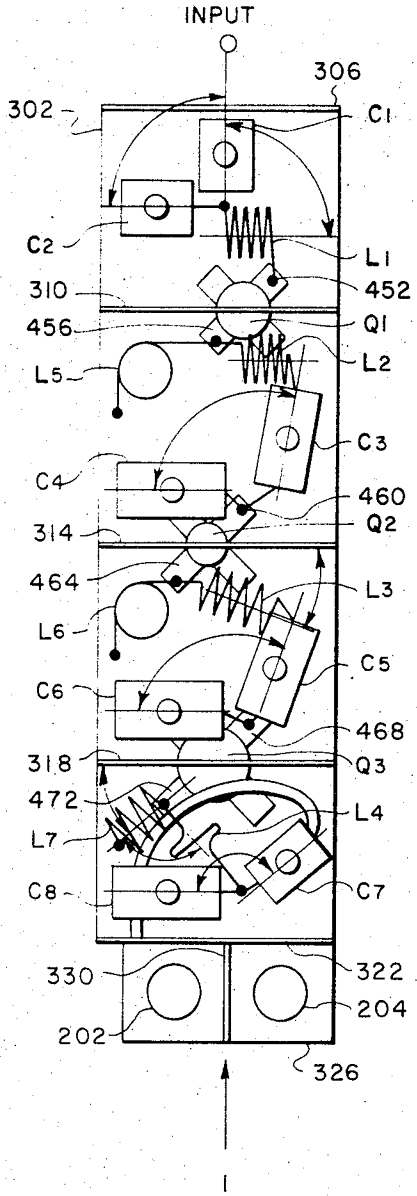
FIG. 4 shows a top view of the amplifier of FIG. 3.
Figure 5:
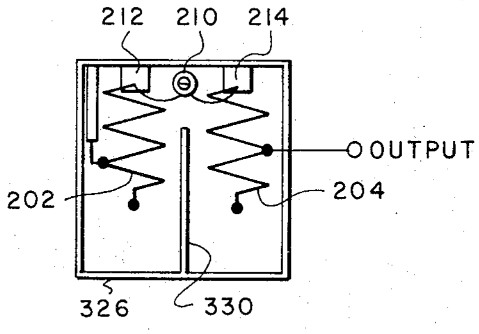
FIG. 5 is an end view of the FIG. 3 circuitry looking in the direction of arrow 1 in FIG. 3.

It has been discovered that by the judicious arrangement and positioning of the components of FIG. 1 that an efficiency of about 62 percent can be obtained while, at the same time, a compact circuit package can be provided. The spatial arrangement of the components in accordance with the present invention is shown in FIGS. 3 through 5. FIG. 3 shows a perspective view of the physical arrangement of the components of concern and of the housing of the circuit. FIG. 4 shows a top view of the physical arrangement with indications of the axes of the coils and capacitors and the angles such axes make with certain other axes. The reference letters and numerals used in FIGS. 3 through 5 correspond to those used in FIGS. 1 and 2. The configurations of FIGS. 4 and 5 are drawn substantially to scale. The spatial relationship of the components of concern will now be discussed.

The only components whose positioning and orientation are critical to the efficient operation of the circuit are shown and labeled in FIG. 4. The other components of the circuit, which are of smaller size than those shown, may be placed in essentially any position and orientation.

The orientation of the components of FIG. 4 may best be described by first defining certain axes of the components. The axis of a coil is a straight line extending through the center of the coil so that the coil circumscribes the line as shown in FIG. 4. The first axis of a protensive capacitor (having rectangularly shaped plates) will be defined as a straight line or coordinate extending between the plates in the direction of the long dimension of the plates as shown in FIG. 4. The second axis of a capacitor will be defined to be a straight line intersecting the plates at their geometric center point in a direction perpendicular to the surface of the plates. Thus, with respect to the capacitors shown in FIG. 4, the second axes of the capacitors would extend out of the drawings perpendicular or normal to the surface thereof. The capacitors C1 through C8 of FIGS. 3 and 4 might illustratively comprise variable mica capacitors.

The structure of FIGS. 3 and 4 includes a grounded metallic plate 302 on which the other components are mounted. One end of the plate 302 is shaped to form a right angle with the remaining portion of the plate to thereby form a shield 306. The plate 302 comprises a conductive material such as brass. Capacitors C1 and C2 and the coil L1 are mounted on the plate 302 at locations to one side of the shield 306 at positions normal to the inner surface of said one side. A position "normal" to a surface is defined as one which is so located that a line may be extended from that position to intersect the surface at an angle perpendicular or normal thereto.

The first axis of the capacitor C1 is substantially perpendicular to the surface of the shield 306 and the first axis of the capacitor C2 is substantially perpendicular to the first axis of the capacitor C1 as shown in FIG. 4. The axis of the coil L1 is substantially perpendicular to the first axis of the capacitor C1 and is substantially parallel to the first axis of the capacitor C2. The first axes of the capacitors C1 and C2 and the axis of the coil L1 need not necessarily be coplana. The second axes of the capacitor C1 or C2 are substantially parallel with each other. The coil L1 is connected to the base terminal 452 of the transistor Q1. A conductive plate 310, spaced from the shield 306 and substantially parallel thereto, is mounted on the plate 302 so as to "straddle" the transistor Q1 and thereby form a partition between the components C1, C2 and L1 and the other components of the circuit shown in FIG. 4.

The collector terminal 456 of the transistor Q1 is connected to the coils L5 and L2 located to one side of the plate 310 (opposite that on which the components C1, C2 and L1 are located) at positions normal to the surface thereof. The axis of the coil L2 is substantially parallel with the surface of the plate 310 and is substantially perpendicular with the axis of the coil L5 which extends out of the drawing perpendicular to the surface thereof. The capacitors C3 and C4 are located to the side of coils L2 and L5 away from the plate 310. The first axis of the capacitor C4 is substantially parallel with the surface of the plate 310. The first axis of the capacitor C3 is at an angle of substantially 100 degrees with the first axis of the capacitor C4 and at an angle of substantially 80 degrees with the axis of the coil L2. The second axis of the capacitors C3 and C4 are substantially parallel with respect to each other. The capacitors C3 and C4 are both connected to the base terminal 460 of the transistor Q2 which is "straddled" by a conductive plate 314 mounted on the plate 302 as shown in FIGS. 3 and 4. The plate 314 is spaced from and is substantially parallel with the plate 310 and serves as a partition between the components L2, L5, C3 and C4 and the components yet to be discussed. The collector terminal 464 of transistor Q2 is located to the side of the plate 314 opposite that to which the base terminal is located, and is connected to the coils L3 and L6. The axis of the coil L6 is substantially parallel to the plate 314 and is substantially perpendicular to the axis of the coil L3. The axis of the coil L3 is at an angle of substantially 20 degrees with the surface of the plate 314. The first axis of the capacitor C5 is substantially perpendicular to the axis of the coil L3 and at an angle of substantially 110 degrees with the first axis of the capacitor C6 which, in turn, is substantially parallel to the surface of the plate 314.

A conductive plate 318, spaced from the plate 314 and substantially parallel thereto, "straddles" the capacitor Q3. The base terminal 468 of the transistor Q3 is connected to the capacitors C5 and C6 and the collector terminal 472 of transistor Q3 is connected to the coils L4 and L7. The axes of the coils L4 and L7 are substantially perpendicular to each other and in a plane which is substantially perpendicular to the surface of plate 318. The axis of the coil L7 is at an angle of about 40 degrees with the surface of the plate 318. Capacitors C7 and C8 are positioned to the side of the coils L4 and L7 away from the plate 318 as shown in FIG. 4. The first axis of the capacitor C8 is substantially parallel to the surface of the plate 318 and at an angle of about 140 degrees from the first axis of the capacitor C7. The second axes of the capacitors C7 and C8, as with the other capacitors, are substantially parallel. The first axis of the capacitor C7 is about perpendicular with the axis of the coil L4.

The harmonic filter, whose circuit is shown in FIG. 2, is located in a housing 326 shown in FIGS. 3, 4 and 5. A conductive plate 322 segregates the components L4, L7, C7 and C8 from the components of the filter. The plate or shield 322, spaced from the plate 318 and substantially parallel thereto, is mounted on the plate 302. The axes of the two coils 202 and 204 of the filter are substantially parallel to the plate 322 and substantially parallel with respect to each other extending upwardly from the surface of the drawing of FIG. 4. A conductive plate 330 is mounted on the plate 322 substantially perpendicular thereto to provide a partition between the coils 202 and 204. The axes of the coils 202 and 204 are substantially parallel to the plate 330. FIG. 5 gives a view of the filter looking in the direction of arrow 1 of FIGS. 3 and 4. FIG. 5 also shows the locations of the capacitors 210, 212 and 214 which, however, are not critical to the present invention.

As indicated in FIG. 3, the circuitry of the amplifier is completely encased in a conductive housing 360 to further isolate the components of the amplifier from any circuitry located near the amplifier.

It has been found that spatially arranging the components in accordance with FIGS. 3 through 5 provides a highly efficient amplifier for amplifying a signal of 158 megahertz and generally for amplifying signals in the bandwidth of 148 to 174 megahertz. Some angular variation of the positioning and orientation of the components of FIGS. 3 and 4 may be made without seriously affecting the efficiency of the circuit, but the circuit as substantially shown in FIGS. 3 and 4 provides a most efficient operation—this efficiency being significantly better than that obtained with the prior art configuration.

What is claimed is:

1. A radio frequency power final amplifier including a first capacitor, a transistor, a first inductance coil one end of which is connected to said first capacitor and the other end of which is connected to the base of said transistor, a second capacitor one side of which is connected to the interconnection of said first capacitor and said coil and the other side of which is connected to a ground potential source, a second inductance coil one end of which is connected to the collector of said transistor and the other end of which is connected to a power source, a third inductance coil one end of which is connected to the collector of said transistor, a third capacitor one side of which is connected to the other end of said third coil, a fourth capacitor one side of which is connected to the other side of said third capacitor and the other side of which is connected to a ground potential source, and a first grounded conductive plate positioned so that said first and second capacitors and said first coil located to one side of said plate in close proximity to one surface thereof and said second and third coils, and third and fourth capacitors are located to the other side of said plate in close proximity to the other surface thereof, said first coil being positioned so that the axis of said first coil is substantially parallel to said one surface and said second and third coils being positioned so that the axes thereof are substantially parallel to said other surface and substantially perpendicular with respect to each other.

2. The amplifier of claim 1 wherein the plates of said first and second capacitors are substantially rectangular in shape and wherein said first and second capacitors are positioned at a distance from said one surface farther than the distance of said first coil from said one surface and so that the first axes of said first and second capacitors are substantially perpendicular with respect to each other, the second axes of said first and second capacitors are substantially parallel with each other, and the first axis of said second capacitor is subsantially parallel with the axis of said first coil, wherein the first axis of a capacitor having substantially rectangularly shaped plates is defined as a coordinate directed along the long dimension of the plates thereof and wherein the second axis of a capacitor is defined as a coordinate normal to the plates thereof.

3. The amplifier of claim 2 wherein the plates of said third and fourth capacitors are substantially rectangular in shape and wherein said third and fourth capacitors are positioned at a distance from said other surface farther than the distance of said second and third coils from said other surface and so that the first axes of said third and fourth capacitors are at an angle of substantially 100 degrees with respect to each other, the first axis of said third capacitor is at an angle of substantially 80 degrees with the axis of said third coil, the first axis of said fourth capacitor is substantially parallel with the axis of said third coil and the second axes of said third and fourth capacitors are substantially parallel with each other and with the axis of said second coil.

4. The amplifier of claim 1 further including a second transistor whose base is connected to the interconnection of said third and fourth capacitors, a fourth inductance coil one end of which is connected to the collector of said second transistor and the other end of which is connected to a power source, a fifth inductance coil one end of which is connected to the collector of said second transistor, a fifth capacitor one side of which is connected to the other end of said fifth coil, a sixth capacitor one side of which is connected to the other side of said fifth capacitor and the other side of which is connected to a ground potential source, and a second grounded conductive plate spaced from said first plate, oriented substantially parallel thereto, and positioned so that said second and third coils and third and fourth capacitors are located to one side of said second plate between said first and second plates and in close proximity to one surface of said second plate and said fourth and fifth coils and fifth and sixth capacitors are located to the other side of said second plate in close proximity to the other surface thereof, said fourth and fifth coils being positioned so that the axes thereof are substantially perpendicular with respect to each other and so that the axis of said fourth coil is substantially parallel to said other surface of said second plate and the axis of said fifth coil is at an angle of substantially 20 degrees with said other surface of said second plate.

5. The amplifier of claim 4 wherein the plates of said fifth and sixth capacitors are substantially rectangular in shape and wherein said fifth and sixth capacitors are positioned at a distance from said other surface of said second plate farther than the distance of said fourth and fifth coils from said other surface of said second plate and so that the second axes of said fifth and sixth capacitors are substantially parallel with each other, the first axis of said sixth capacitor is substantially parallel to said other surface of said second plate, and the first axis of said fifth capacitor is substantially perpendicular to the axis of said fifth coil and at an angle of substantially 110 degrees with the first axis of said sixth capacitor.

6. The amplifier of claim 4 further including a third transistor whose base is connected to the interconnection of said fifth and sixth capacitors, a sixth inductance coil one end of which is connected to the collector of said third transistor and the other end of which is connected to a power source, a seventh inductance coil one end of which is connected to the collector of said third transistor, a seventh capacitor one side of which is connected to the other end of said seventh coil, an eighth capacitor one side of which is connected to the interconnection of said seventh coil and said seventh capacitor and the other side of which is connected to a ground potential source, and a third grounded conductive plate spaced from said other surface of said second plate, oriented substantially parallel with said first and second plates, and positioned so that said fourth and fifth coils and fifth and sixth capacitors are located to one side of said third plate between said second and third plates in close proximity to one surface of said third plate and said sixth and seventh coils and seventh and eighth capacitors are located to the other side of said third plate in close proximity to the other surface thereof, said sixth and seventh coils being positioned so that the axes thereof are substantially perpendicular with respect to each other and so that the axis of said sixth coil is at an angle of substantially 40 degrees with said other surface of said third plate and the axis of said seventh coil is at an angle of substantially 50 degrees with said other surface of said third plate.

7. The amplifier of claim 6 wherein the plates of said seventh and eighth capacitors are substantially rectangular in shape and wherein said seventh and eighth capacitors are positioned at a distance from said other surface of said third plate farther than the distance of said sixth and seventh coils from said other surface of said third plate and so that the second axes of said seventh and eighth capacitors are substantially parallel with respect to each other, the first axis of said seventh capacitor is substantially perpendicular to the axis of said seventh coil, and the first axis of said eighth capacitor is substantially parallel with the other surface of said third plate and at an angle of substantially 140 degrees with the first axis of said seventh capacitor.

8. The amplifier of claim 6 wherein the axes of said sixth and seventh coils lie in substantially the same plane which is substantially perpendicular to said other surface of said third plate.

9. The amplifier of claim 6 further comprising an output terminal, an eighth coil one end of which is connected to a ground potential source and having a tap connected to said seventh capacitor, a ninth inductance coil one end of which is connected to a ground potential source and having a tap connected to said output terminal, a ninth capacitor one side of which is connected to the other end of said eighth coil and the other side of which is connected to the other end of said ninth coil, a tenth capacitor connected in parallel with said eighth coil, an eleventh capacitor connected in parallel with said ninth coil, a fourth grounded conductive plate spaced from said third plate, oriented substantially parallel thereto, and positioned so that said sixth and seventh coils and seventh and eighth capacitors are located to one side of said fourth plate between said third and fourth plates in close proximity to one surface of said fourth plate, and said eighth and ninth coils are located to the other side of said fourth plate in close proximity to the other face thereof, and a fifth grounded conductive plate forming a shield between said eighth and ninth coils, the axes of said eighth and ninth coils being substantially parallel with each other, with the other face of said fourth plate, and with the surfaces of said fifth plate.

10. The amplifier of claim 9 further comprising a grounded conductive housing for enclosing the capacitors, coils, transistors and plates of said amplifier.

11. A radio frequency power amplifier comprising an input terminal, an output terminal, first, second and third transistors the emitters of which are each connected to a ground potential source, a first capacitor connected to said input terminal, a first inductance coil interconnecting said first capacitor with the base of said first transistor, a second capacitor and second inductance coil connected in series and interconnecting the collector of said first transistor with the base of said second transistor, a third capacitor and third inductance coil connected in series and interconnecting the collector of said second transistor with the base of said third transistor, a fourth capacitor connected to said output terminal, a fourth inductance coil interconnecting said fourth capacitor to the collector of said third transistor, a first conductive plate for electrically isolating the electromagnetic fields generated by said first capacitor and first coil from the electromagnetic fields generated by said second capacitor and second coil, a second conductive plate for electrically isolating the electromagnetic fields generated by said second capacitor and second coil from the electronmagnetic fields generated by said third capacitor and third coil, and a third conductive plate for electrically isolating the electromagnetic fields generated by said third capacitor and third coil from the electromagnetic fields generated by said fourth capacitor and fourth coil, said first coil being located to one side of said first plate at a position normal to one surface thereof so that the axis of said first coil is substantially parallel with said one surface, said second coil being located to the other side of said first plate and between said first and second plates at a position normal to the other surface of said first plate and normal to one surface of said second plate so that the axis of said second coil is substantially parallel to the other surface of said first plate and to the one surface of said second plate, said third coil being located to the other side of said second plate and between said second and third plates at a position normal to the other surface of said second plate and normal to one surface of said third plate so that the axis of said third coil is at an angle of about 20 degrees from the other surface of said second plate and the one surface of said third plate, and said fourth coil being located to the other side of said third plate at a position normal to the other surface of said third plate so that the axis of said fourth coil is at an angle of about 50 degrees from the other surface of said third plate.

12. The amplifier of claim 11 wherein the plates of each of said capacitors are substantially rectangular in shape and wherein said first capacitor is positioned so that the first axis of said first capacitor is substantially perpendicular to the axis of said first coil, said second capacitor is positioned so that the first axis of said second capacitor is at an angle of about 80 degrees from the axis of said second coil, said third capacitor is positioned so that the first axis of said third capacitor is substantially perpendicular to the axis of said third coil, and said fourth capacitor is positioned so that the first axis of said fourth capacitor is substantially perpendicular to the axis of said fourth coil, the first axis of a capacitor having substantially rectangularly shaped plates being defined as a coordinate directed along the long dimension of the plates thereof and the second axis of a capacitor being defined as a coordinate normal to the plates thereof.

13. The amplifier of claim 12 wherein each of said capacitors are positioned so that the second axes thereof are substantially parallel with each other and with the surfaces of said plates.

14. The amplifier of claim 11 further comprising a fifth induction coil interconnecting the collector of said first transistor with a power source, a sixth induction coil interconnecting the collector of said second transistor with a power source, and a seventh induction coil interconnecting the collector of said third transistor with a power source, said fifth coil being located between said first and second plates and positioned so that the axis of said fifth coil is substantially perpendicular to the axis of said second coil and substantially parallel with the other surface of said first plate, said sixth coil being located between said second and third plates and positioned so that the axis of said sixth coil is substantially perpendicular to the axis of said third coil and substantially parallel to the other surface of said second plate, and said seventh coil being located to the other side of said third plate and positioned so that the axis of said seventh coil is substantially perpendicular to the axis of said fourth coil and is at an angle of about 40 degrees from the other surface of said third plate.

15. The amplifier of claim 14 wherein the axes of said fourth and seventh coils are in a plane substantially perpendicular to the other surface of said third plate.

16. The amplifier of claim 15 further including a fifth capacitor interconnecting the node between said first capacitor and said first coil with a ground potential source, a sixth capacitor interconnecting the base of said second transistor with a ground potential source, a seventh capacitor interconnecting the base of said third transistor with a ground potential source, and an eigth capacitor interconnecting the node between said fourth coil and said fourth capacitor with a ground potential source, said fifth capacitor being located to the one side of said first plate and being positioned so that the first axis of said fifth capacitor is substantially parallel to the one surface of said first plate and substantially prependicular to the first axis of said first capacitor, said sixth capacitor being located between said first and second plates and being positioned so that the first axis of said sixth capacitor is substantially parallel to the one surface of said second plate and at an angle of about 100 degrees from the first axis of said second capacitor, said seventh capacitor being located between said second and third plates and being positioned so that the first axis of said seventh capacitor is substantially parallel to the one surface of said third plate and at an angle of about 110 degrees from the first axis of said third capacitor, and said eighth capacitor being located on the other side of said third plate and being positioned so that the first axis of said eighth capacitor is substantially parallel to the other surface of said third plate and at an angle of about 140 degrees from the first axis of said fourth capacitor.

17. The amplifier of claim 16 further including an eighth inductance coil one end of which is connected to a ground potential source and having a tap connected to said output terminal, a ninth inductance coil one end of which is connected to a ground potential source and having a tap connected to a second output terminal, a ninth capacitor interconnecting the other ends of said eighth and ninth coils, a tenth capacitor connected in parallel with said eighth coil, an eleventh capacitor connected in parallel with said ninth coil, a fourth conductive plate for electrically isolating the electromagnetic fields generated by said fourth and seventh coils and fourth and eighth capacitors from the electromagnetic fields generated by said eighth and ninth coils and ninth, tenth and eleventh capacitors, and a fifth conductive plate for electrically isolating the electromagnetic fields generated by said eighth coil from the electromagnetic field generated by said ninth coil, said fourth and seventh coils and said fourth and eighth capacitors being located to one side of said fourth plate at positions normal to one surface thereof, said eighth coil being located to the other side of said fourth plate at a position normal to the other surface thereof so that the axis of said eighth coil is substantially parallel with said fourth plate, said ninth coil being located on the other side of said fourth plate at a position normal to the other surface thereof so that the axis of said ninth coil is substantially parallel with said fourth plate, said fifth plate being positioned between said eighth and ninth coils so that one surface of said fifth plate is substantially parallel to the axis of said eighth coil and the other surface of said fifth plate is substantially parallel to the axis of said ninth coil.

18. The amplifier of claim 17 further including a conductive housing for enclosing the components of said amplifier.

19. A radio frequency power amplifier comprising components identified and positioned substantially as shown in FIGS. 3 and 4 of the drawings.

No references cited.

NATHAN KAUFMAN, Primary Examiner

U.S. Cl. X.R.

330—68